US005587886A

United States Patent [19]

Lan

[11] Patent Number: 5,587,886

[45] Date of Patent: Dec. 24, 1996

[54] STRUCTURE FOR CONTACT POINTS OF A SHIFT SWITCH USED IN A COMPUTER

[75] Inventor: Si-Chi Lan, Taipei, Taiwan

[73] Assignee: Kinpo Electronics, Taipei, Taiwan

[21] Appl. No.: 434,507

[22] Filed: May 4, 1995

[51] Int. Cl.$^{6}$ .............................. H01H 1/20; H01H 1/44; H01H 1/10; H05K 7/02

[52] U.S. Cl. .......................... 361/781; 200/243; 200/252; 200/257; 200/279; 200/292; 361/837; 439/246

[58] Field of Search .................................... 200/243, 252, 200/257, 279, 292; 361/781, 828, 832, 837; 439/250, 246; 174/53, 54

[56] References Cited

U.S. PATENT DOCUMENTS

| | | | |
|---|---|---|---|
| 3,544,740 | 12/1970 | Robin | 200/292 |
| 3,592,983 | 7/1971 | Kroll | 200/292 |
| 4,107,499 | 8/1978 | Weidler | 200/292 |
| 4,276,460 | 6/1981 | Haesly et al. | 200/292 |
| 4,486,637 | 12/1984 | Chu | 200/292 |
| 4,737,602 | 4/1988 | Yamamoto | 200/292 |
| 5,357,069 | 10/1994 | Nishio et al. | 200/252 |

*Primary Examiner*—Donald A. Sparks
*Attorney, Agent, or Firm*—Pro-Techtor International

[57] ABSTRACT

A structure for contact points of a shift switch used in a computer. The structure includes an elastic contact plate disposed under the shift switch and having projecting contact points to contact the corresponding conductive contact portions of the circuit board. A sloped slot is formed between adjacent contact portions to separate the contact portions from each other and to avoid detachment and scattering of the conductive material of the contact portions. The contact points are designed with an elongated shape so as to provide a smooth sliding motion of the contact points through the sloped slots.

1 Claim, 4 Drawing Sheets

STRUCTURE FOR CONTACT POINTS OF A SHIFT SWITCH USED IN A COMPUTER

BACKGROUND OF THE INVENTION

The present invention relates to a computer-used switch structure of contact points of shift switch and contact portions of circuit board. The switch structure includes an elastic contact plate disposed under the shift switch and having projecting contact points for contacting with corresponding conductive contact portions of the circuit board. A slope slot is formed between each two adjacent contact portions to separate the contact portions from each other and avoid detachment and scattering of the conductive material of the contact portions, which may make a short circuit, caused by long term of reciprocal sliding of the contact points between the contact portions.

A conventional computer-used switch structure mainly includes a contact roller coated by a layer of carbon paste and disposed under the switch, whereby the contact roller reciprocally rolls on the carbon paste-made contact portions of a printed circuit board to changingly make the circuit. In such switch structure, the contact roller is quite expensive and a relatively great force is necessary for shifting the switch. FIGS. 1 and 2 show another type of conventional computer-used switch structure, wherein a separating membrane 13 is located between the switch and the circuit board 15 printed with electronic circuit 14. The separating membrane 13 is formed with contact slots 12 in alignment with contact points 10 printed on a contact membrane 11. The separating membrane 13 is sandwiched between the circuit board 15 and the contact membrane 11, permitting the contact points 10 to contact with the contact points 141 of the electronic circuit 14 of the circuit board 15. When the shift switch 20 covering the contact membrane 11 is shifted to depress the conductive contact points 10, the same pass through the slots 12 to contact with the contact points 141 of the circuit board 15 and make the circuit. At this time, the adjacent contact points are kept insulated. Such switch structure is widely used. However, several shortcomings still exist therein as follows:

1. It is troublesome to assemble the contact membrane 11 with the separating membrane 13 and it often takes place that only one of the two membranes is mounted in the switch (with the other neglected) by human incaution.
2. It often takes place that the two membranes are mounted in an incorrect position.
3. The intermediate separating membrane is made by additional molds and materials. This increases the manufacturing cost and time.
4. The switch structure is composed of more components so that the assembling cost is increased.

Accordingly, the above two conventional switch structures are both not ideal and the quality thereof cannot be ensured. Therefore, it is necessary to provide a more reliable and more economic computer-used switch structure to eliminate the above problems.

SUMMARY OF THE INVENTION

It is therefore a primary object of the present invention to provide a computer-used switch structure which can be directly shifted to selectively conduct electricity without using any other media so as to save the cost for material and processing. The structure includes an elastic contact plate disposed under the shift switch and having projecting contact points to contact the corresponding conductive contact portions of the circuit board. A sloped slot is formed between adjacent contact portions to separate the contact portions from each other and to avoid detachment and scattering of the conductive material of the contact portions. The contact points are designed with an elongated shape so as to provide a smooth sliding motion of the contact points through the sloped slots.

It is a further object of the present invention to provide the above switch structure in which the contact points are designed with elongated shape so as to smoothen the sliding movement of the contact points through the slope slots without being trapped therein.

The present invention can be best understood through the following description and accompanying drawings, wherein:

DETAILED DESCRIPTION OF THE PREFERRED EMBODIMENT

Figure 1:
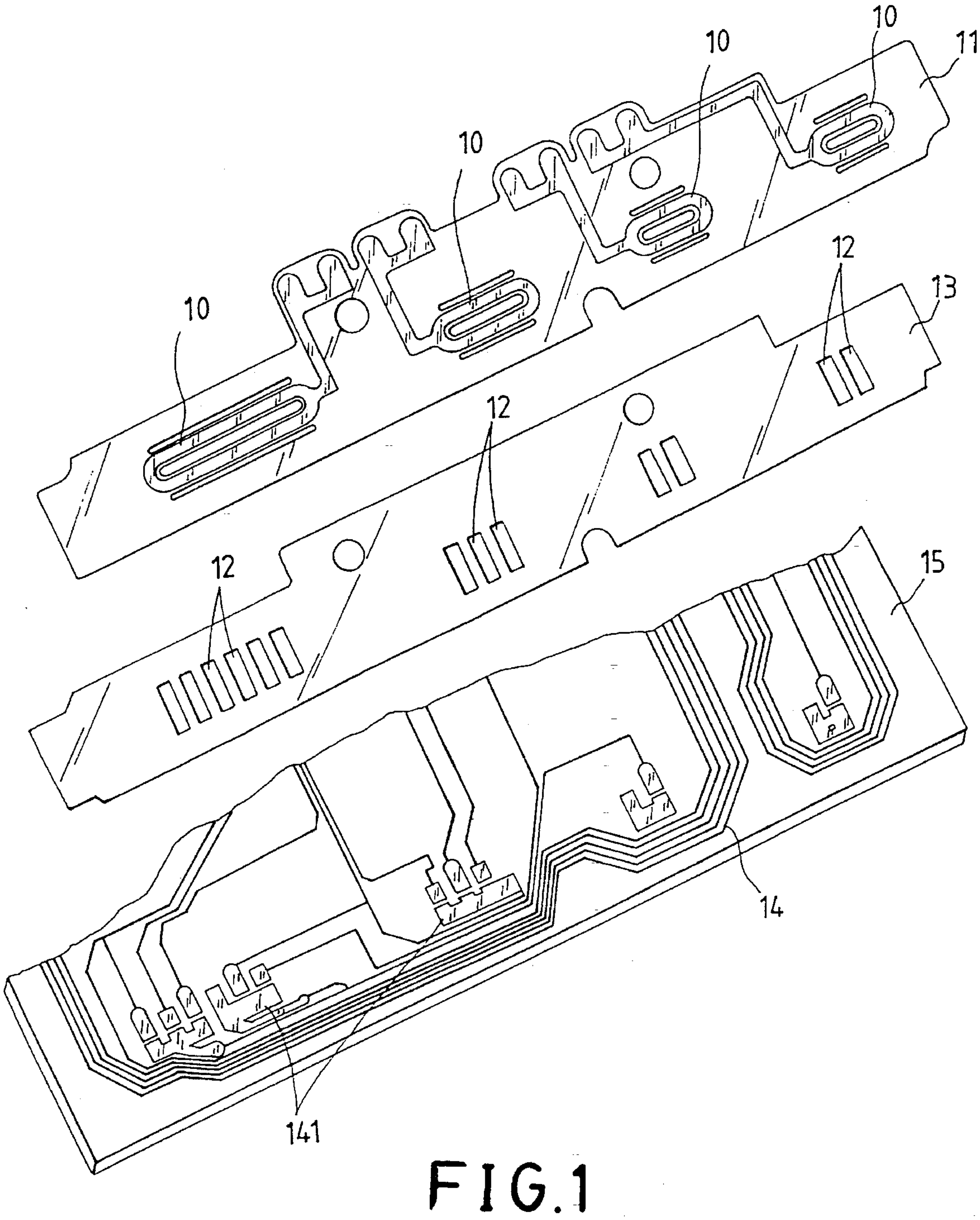
FIG.1 Prior Art
FIG. 1 is a perspective exploded view of a conventional computer-used switch structure employing a separating membrane sandwiched between a contact membrane and a printed circuit board.
Figure 2:
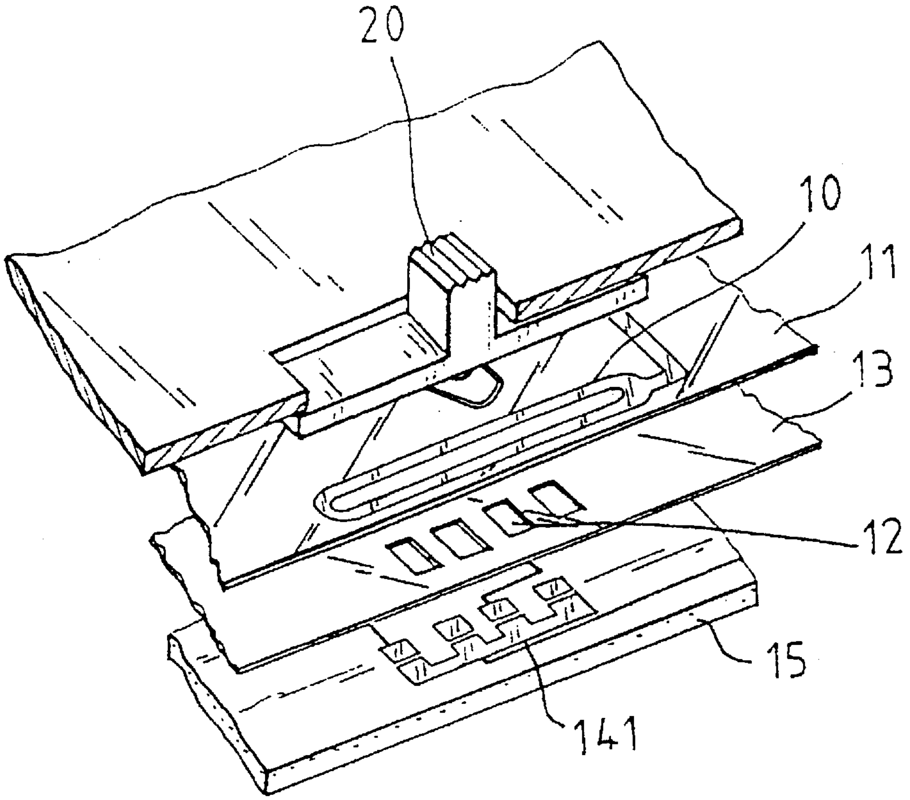
FIG.2 Prior Art
FIG. 2 is a view showing the relationship between the assembled separating membrane, contact membrane and printed circuit board.
Figure 3:
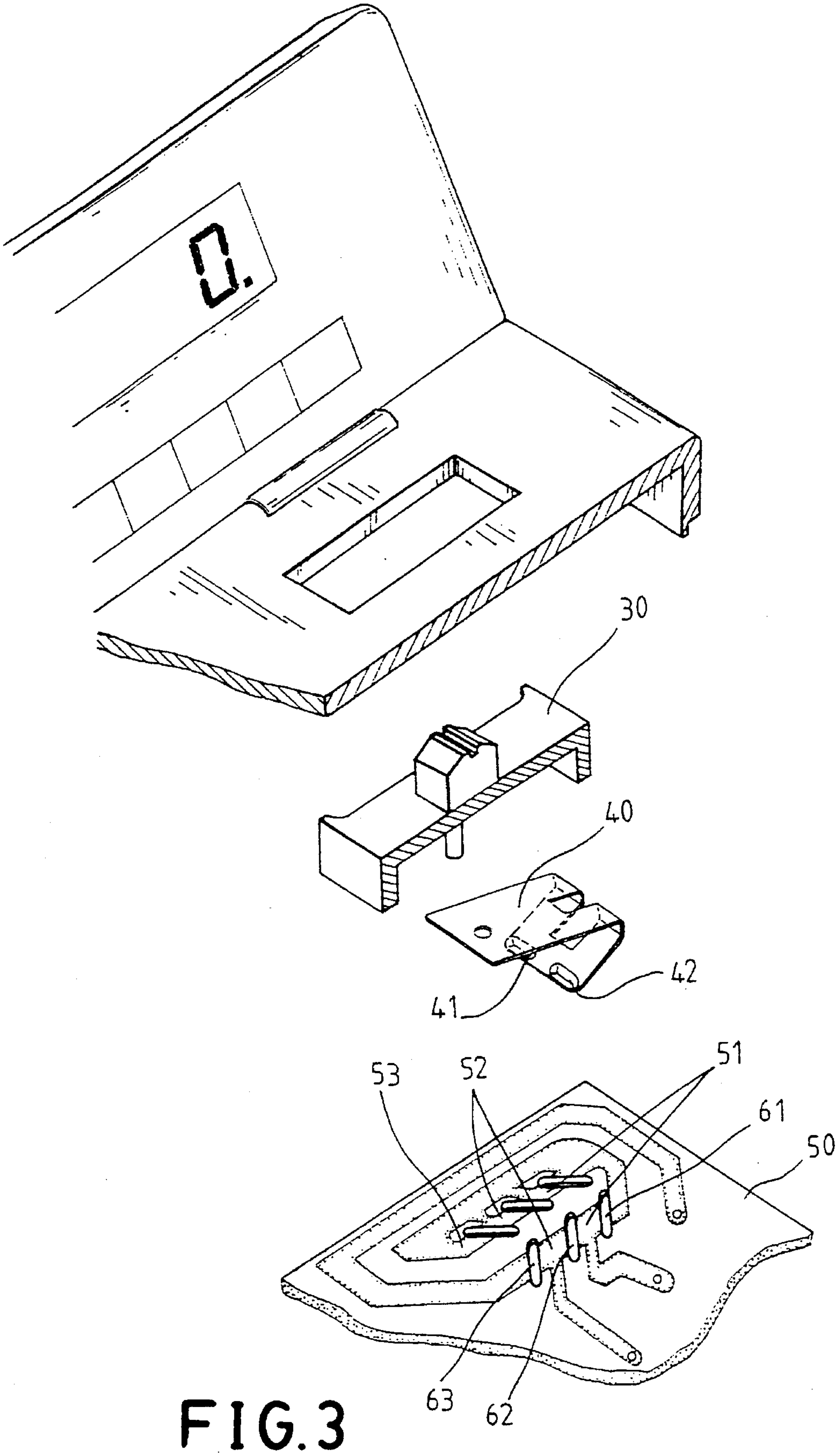
FIG. 3 is a perspective exploded view of the present invention.
Figure 4:
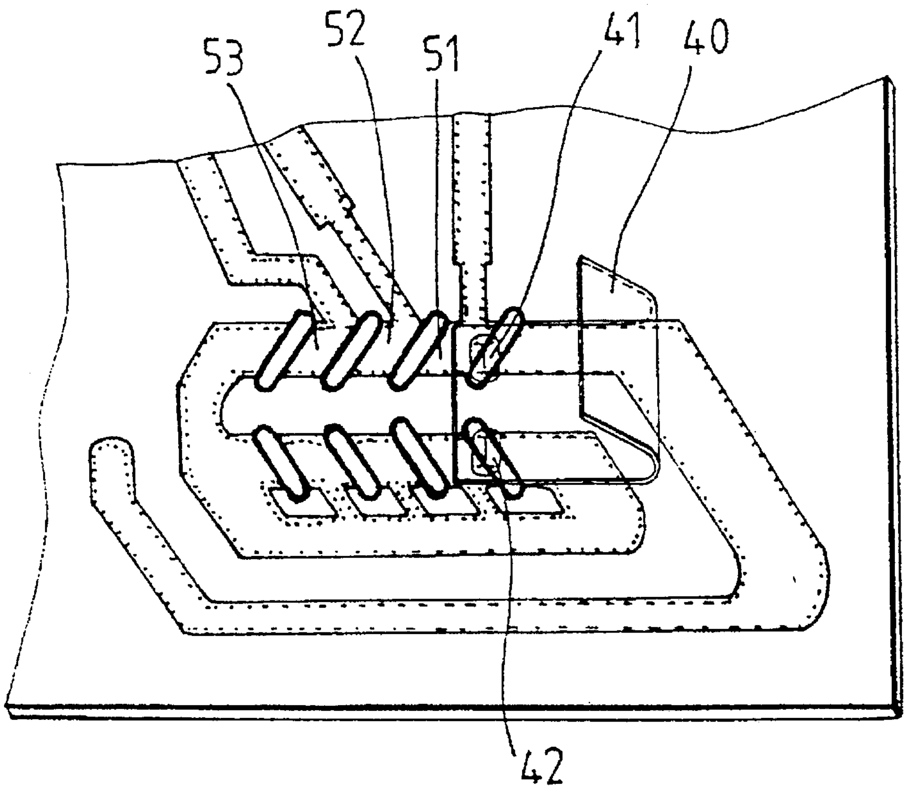
FIG. 4 is a top view of the present invention, showing that the metal elastic contact plate is slidably disposed over the printed circuit board to selectively contact with the contact portions thereof.
Figure 5:
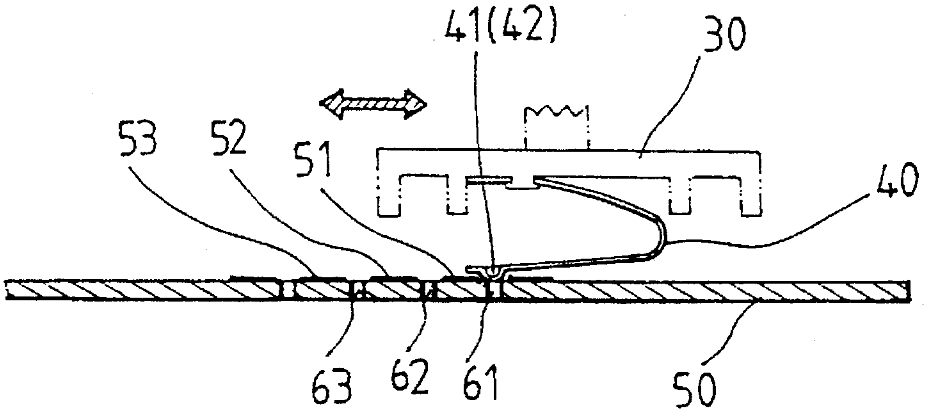
FIG. 5 is a side sectional view according to FIG. 4, showing the sliding movement of the shift switch.

Please refer to FIGS. 3 to 5. A metal elastic contact plate 40 is disposed under a shift switch 30. The contact plate 40 has two projecting contact points 41, 42 at lower end. A circuit board 50 printed with conductive contact portions 51, 52, etc. is disposed under the contact plate 40, whereby the contact points 41, 42 can correspondingly contact certain conductive contact portions such as 51 and contact other contact portions such as 52 after shifted. A slope slot 61, 62, etc. is formed between each two adjacent contact portions 51, 52. The slope slot 61 is suitably inclined from the shifting direction of the contact plate 40 to separate the contact portions 51, 52 from each other, so that each time the contact points 41, 42 slide through one pair of the slope slots 61, 62, the contact points 41, 42 can contact another pair of contact portions. The slope slots 61, 62 not only serve to separate the adjacent contact portions, but also serve to avoid detachment and scattering of the conductive material of the contact portions, which may make a short circuit, caused by long term of reciprocal sliding of the contact points 41, 42 between the contact portions 51, 52. The contact points 41, 42 are designed with elongated spheric shape so that the contact points can contact the contact portions in a line or face pattern in order to reduce the contact pressure and smoothen the sliding movement of the contact points through the slope slots 61, 62, etc. without being trapped therein.

According to the above arrangement, the contact plate 40 of the present invention can be directly shifted to selectively conduct electricity without using any other media such as contact roller or contact membrane. Therefore, the number of the components is reduced and the manufacturing and assembling cost is lowered. Moreover, the slope slots between the contact portions effectively prevent the conductive material of the adjacent contact portions from detaching therefrom and scattering over to make a short circuit. The contact points are designed with elongated shape so that when shifted, the contact points will not be trapped in the slots. The above description and accompanying drawings are only used to illustrate one embodiment of the present invention and not intended to limit the scope thereof. Many derivations or modifications of the embodiment can be made without departing from the spirit of the present invention.

What is claimed is:

1. A structure for contact points of a shift switch used in a computer comprising:

an elastic contact plate disposed under the shift switch and having a plurality of projecting contact points at a lower end thereof to contact the corresponding conductive contact portions of a circuit board, said contact portions are arranged on said circuit board in a series along a shifting direction of said shift switch, with a slot that is inclined along the direction of travel of said shift switch, said slots being formed between each pair of adjacent contact portions to separate said contact portions from each other.

* * * * *